(12) United States Patent
Saita et al.

(10) Patent No.: US 7,450,397 B2
(45) Date of Patent: Nov. 11, 2008

(54) WIRING BOARD AND CIRCUIT APPARATUS

(75) Inventors: Atsushi Saita, Kobe (JP); Toshikazu Imaoka, Ogaki (JP); Tetsuro Sawai, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 405 days.

(21) Appl. No.: 11/388,705

(22) Filed: Mar. 24, 2006

(65) Prior Publication Data
US 2006/0216484 A1 Sep. 28, 2006

(30) Foreign Application Priority Data
Mar. 24, 2005 (JP) ............................. 2005-087095
Mar. 17, 2006 (JP) ............................. 2006-075339

(51) Int. Cl.
H05K 7/02 (2006.01)
H05K 7/06 (2006.01)
H05K 7/08 (2006.01)
H05K 7/10 (2006.01)

(52) U.S. Cl. ......................... 361/780; 361/792; 361/794

(58) Field of Classification Search ......... 361/792–795, 361/780–782; 333/12, 33
See application file for complete search history.

(56) References Cited

U.S. PATENT DOCUMENTS 5,559,480 A * 9/1996 Ivanivsky ................. 333/21 R
6,483,406 B1 * 11/2002 Sawa et al. ................. 333/247
7,172,958 B2 * 2/2007 Sasaki ....................... 438/617

FOREIGN PATENT DOCUMENTS

| JP | 63-160363 | 7/1988 |
|---|---|---|
| JP | 2002-76644 | 11/1990 |
| JP | 10-242599 | 9/1998 |
| JP | 10-290105 | 10/1998 |
| JP | 2000-183232 | 6/2000 |
| JP | 2003-069239 | 3/2003 |

* cited by examiner

*Primary Examiner*—Tuan T Dinh
(74) *Attorney, Agent, or Firm*—Fish & Richardson P.C.

(57) ABSTRACT

A wiring board in which a line can be made narrower and/or a transmission loss can be reduced is developed. The wiring board includes a first conductor and a second conductor maintained at the same potential, a dielectric material layer provided between the first and second conductors, and a third conductor embedded in the dielectric material layer. In the wiring board, a thickness of the dielectric material layer in a first region located between the third conductor and the first conductor is larger than a thickness of the dielectric material layer in a second region located between the third conductor and the second conductor. Moreover, a cross-sectional shape of the third conductor is trapezoidal in which angles of respective ends of the third conductor on a side closer to the second conductor are obtuse.

10 Claims, 10 Drawing Sheets

500

WIRING BOARD AND CIRCUIT APPARATUS

BACKGROUND OF THE INVENTION

1. Field of the Invention

The present invention relates to a wiring board and a circuit apparatus using the same including a signal line and a capacitive element for transmitting a high-frequency signal in a high-frequency circuit or module in which a plurality of electronic components such as semiconductor ICs or chip components are integrated.

2. Description of the Related Art

Conventionally, a wiring board is known which includes a triplate line as means for transmitting a high-frequency signal in a high-frequency circuit or module in which a plurality of electronic components such as semiconductor ICs or chip components are integrated.

FIG. 10 is a cross-sectional view of the structure of a conventional wiring board including the triplate line. The conventional wiring board 500 includes a first grounded conductor 510, a second grounded conductor 520, a dielectric material layer 530 provided between the first and second grounded conductors 510 and 520, and a signal line 540 embedded in the dielectric material layer 530. A cross-sectional shape of the signal line 540 is usually rectangular. In the conventional wiring board 500, a thickness $h_a$, of a first region of the dielectric material layer 530 located between the signal line 540 and the first grounded conductor 510 is equal to a thickness $h_b$, of a second region of the dielectric material layer 530 located between the signal line 540 and the second grounded conductor 520. This structure is shown in FIG. 6 of Japanese Patent Laid-Open Publication No. 2003-69239, for example. A relative dielectric constant $\in_a$, of the first region is equal to a relative dielectric constant $\in_b$, of the second region and a capacitance of the first region with respect to the ground is equal to that of the second region.

The triplate line is called as a strip line in some cases. The term "triplate line" herein can be read as a strip line.

The first grounded conductor 510 and the second grounded conductor 520 may function as capacitive elements in a parallel plate comb structure formed by a first signal line and a second signal line, the first signal line being implemented by the first grounded conductor 510 and the second grounded conductor 520 not grounded and maintained at the same potential, and the second signal line being the signal line 540.

Further reduction in size and lower transmission loss are required in a high-frequency module. In order to achieve those, the wiring board including the triplate line has the following problems. The same problems are encountered in a wiring board with capacitive elements.

Characteristic impedance ($Z_0$) of the triplate line is represented by the expression (1).

$$Z_0 = \sqrt{\frac{L}{C_T}} \quad (1)$$

In the expression (1), $C_T$ (F/m) is a capacitance of the triplate line and represents a capacitance of the signal line with respect to the ground. Taking the conventional wiring board 500 shown in FIG. 10 for example, the capacitance $C_T$ with respect to the ground is determined by a sum of an electrostatic capacitance $C_a$ between the signal line 540 and the first grounded conductor 510 and an electrostatic capacitance $C_b$ between the signal line 540 and the second grounded conductor 520. Moreover, L (H/m) is an inductance of the triplate line.

As is apparent from the expression (1), the characteristic impedance ($Z_0$) is in inverse proportion to a square root of the capacitance $C_T$ with respect to the ground. The capacitance $C_T$ with respect to the ground is in proportion to the width of the signal line. Thus, when a size of the signal line is reduced in the conventional wiring board, the capacitance $C_T$ with respect to the ground is reduced and accordingly the characteristic impedance ($Z_0$) increases. In other words, it is difficult to make the signal line narrower in the conventional wiring board because it is necessary to keep the characteristic impedance ($Z_0$) the same. This makes it difficult to increase density of the high-frequency module.

Next, the problem in reducing the transmission loss in the wiring board will be described.

The transmission loss in the wiring board is determined by a sum of a dielectric loss and a conductor loss.

The dielectric loss is in proportion to a frequency f of a high-frequency signal transmitted in the signal line, a relative dielectric constant $\in r$ of the dielectric material layer, and dielectric tangent tan δ of the dielectric material layer. Thus, the dielectric loss is determined by characteristics intrinsic to an insulating material used for the dielectric material layer under a condition where the frequency f of the high-frequency signal is constant.

On the other hand, the conductor loss is in proportion to a square root of the relative dielectric constant $\in r$, a square root of the frequency f of the high-frequency signal, and a square root of a specific resistance ρ of the signal line.

A skin effect that is related to current density of the signal line will now be described. When a high-frequency signal is transmitted in the signal line, a back electromotive force disturbs a current flow around the center of the signal line and the current density concentrates on the surface of the conductor of the signal line. This phenomenon is called as a skin effect and the depth of the current flow is called as a skin depth δ. The skin depth δ is represented by the expression (2).

$$\delta = \sqrt{\frac{2}{\omega\mu\sigma}} = \sqrt{\frac{1}{\pi f \mu\sigma}} \quad (2)$$

In the expression (2), ω is an angular frequency (rad/s), f is a frequency (Hz), μ is a magnetic permeability of the signal line, and σ is an electric conductivity (S/m).

As is apparent from the expression (2), the current concentrates on the surface of the signal line more and the specific resistance ρ becomes larger apparently, as the frequency f becomes higher. The increase of the specific resistance ρ leads to increase in the conductor loss. Moreover, surface roughness of the signal line becomes a factor of the conductor loss caused by an eddy current. As the skin depth δ becomes smaller, the current is affected by the surface roughness more easily and the conductor loss increases.

The skin effect tends to become pronounced at an edge of the signal line. Thus, in the case where the cross-sectional shape of the signal line is rectangular as in the conventional wiring board, the current density concentrates on each corner.

The conductor loss is in proportion to the square root of the frequency f, too, as described above. Thus, as the frequency f becomes higher, the conductor loss rapidly increases. In this manner, the conductor loss caused by concentration of the current density of the signal line on the surface becomes a problem in the conventional wiring board, especially when the frequency is high.

SUMMARY OF THE INVENTION

It is therefore an object of the present invention to provide a wiring board that can make a signal line narrower and a circuit apparatus using such a wiring board. It is another object of the present invention to provide a wiring board having a reduced transmission loss and improved high frequency characteristics and a circuit apparatus using such a wiring board.

One of the aspects of the present invention is a wiring board. The wiring board comprises: a first conductor; a second conductor provided in a wiring layer different from that of the first conductor and maintained at the same potential as the first conductor; a dielectric material layer provided between the first and second conductors; and a third conductor embedded in the dielectric material layer, wherein a thickness of a first region of the dielectric material layer located between the third conductor and the first conductor is different from a thickness of a second region of the dielectric material layer located between the third conductor and the second conductor, and obtuse angles are formed at the ends of the third conductor facing the thinner of the first region and the second region of the dielectric material layer, in a cross section of the third conductor perpendicular to the direction of signal transmission.

This can reduce the width of the third conductor by increasing capacitance per unit area, given that the desired capacitance remains unchanged. As a result, it is possible to make the capacitive element narrower and make the line narrower in the wiring board. Further, since the skin effect occurring at the ends of the third conductor facing the thinner of the first and second regions of the dielectric material layer is reduced, conductor loss is reduced.

In the above aspect, it is preferable that a relative dielectric constant of thinner one of the first and second regions be higher than that of the other region.

Due to this, the capacitance of the wiring board can be increased. Therefore, the line in the wiring board can be made narrower easily.

In the above aspect, a shape of the third conductor in the cross section perpendicular to the transmission direction of the third conductor may be trapezoidal and a shorter side of the trapezoidal third conductor may face thinner one of the first and second regions of the dielectric material layer.

In the above-described aspects, the first conductor and the second conductor may be grounded. This can cancel an increase in characteristic impedance of a signal line associated with reducing the width of the third conductor, by increasing grounding capacitance with respect to the ground. Accordingly, the line in the wiring board can be made narrower without changing the characteristic impedance of the signal line. Further, since the skin effect occurring at the ends of the third conductor facing the thinner of the first and second regions of the dielectric material layer is reduced, conductor loss is reduced.

Another aspect of the present invention relates to a circuit apparatus which includes one of the above-described wiring boards and a circuit component with grounded wiring, wherein one of the first and second conductors comprises a grounded conductor.

According to this aspect, by allowing the grounded conductor provided in the circuit component to also function as the first conductor, it is possible to form a circuit apparatus in which a two-layer structure of the wiring layers is maintained. As a result, the circuit apparatus not only includes wiring layers that provide the aforementioned benefits but also is formed as a simplified and small-sized structure.

In the above embodiments, one of the conductors may further comprise a conductive adhesive layer adhesively attaching the grounded conductor to the dielectric layer. By allowing the grounded conductor provided in the circuit component and the adhesive layer integrated therewith after mounting to also function as the first conductor, it is possible to form a circuit apparatus in which a two-layer structure of the wiring layers is maintained. As a result, the circuit apparatus not only includes wiring layers that provide the aforementioned benefits but also is formed as a simplified and small-sized structure.

The film thickness of the thinner of the first region and the second region may be between 1.0 and 2.0 times, both inclusive, the thickness of the third conductor. According to this arrangement, current density concentration at the edge of the third conductor due to skin effect is effectively mitigated by allowing concentration to occur also at the upper and lower corners. Thereby, conduction loss is reduced.

It is to be noted that any arbitrary combinations or rearrangement, as appropriate, of the aforementioned constituting elements and so forth are all effective as and encompassed by the embodiments of the present invention and the scope of the invention protected by this patent application.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

First Embodiment

Figure 1:
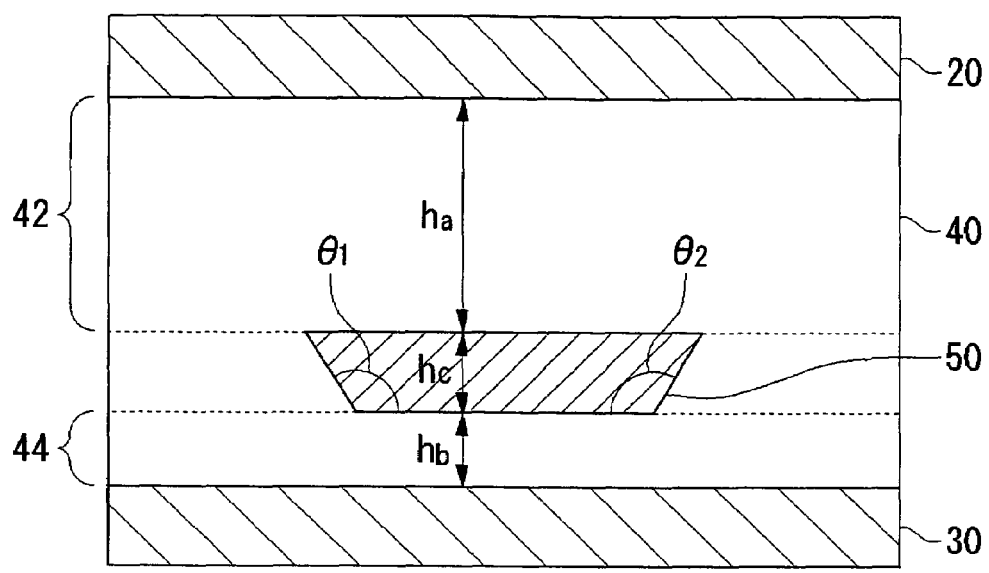
FIG. 1 shows a cross-sectional shape of a wiring board according to an embodiment of the present invention.

FIG. 1 shows a cross-sectional shape of a wiring board 10 according to an embodiment of the present invention. A cross section shown in FIG. 1 is a plane perpendicular to a transmission direction in a wiring board 10. The wiring board 10 includes a first conductor 20, a second conductor 30, a dielectric material layer 40 provided between the first conductor 20 and the second conductor 30, a third conductor 50 embedded in the dielectric material layer 40 and a via (not shown) embedded in the dielectric material layer 40 and electrically connecting the first conductor 20 and the second conductor 30. Thus, the wiring board 10 includes a capacitive element. By grounding the first conductor 20 and the second conductor 30, the wiring board 10 is provided with a triplate line.

In the wiring board 10 of this embodiment, a thickness $h_a$ of a first region 42 of the dielectric material layer 40 located between the third conductor 50 and the first conductor 20 is larger than a thickness $h_b$ of a second region 44 of the dielectric material layer 40 located between the third conductor 50 and the second conductor 30. A cross-sectional shape of the third conductor 50 is trapezoidal and angles θ1 and θ2 of respective ends of the third conductor on a side closer to the second conductor 30 are obtuse. A shorter side of the trapezoid faces the second region 44 of the dielectric material layer 40.

An effect obtained by making the thickness $h_a$ larger than the thickness $h_b$ as in the wiring board 10 of this embodiment is now described.

A capacitance $C_T$ with respect to a ground of the wiring board 10 is determined by a sum of an electrostatic capacitance $C_a$ between the third conductor 50 and the first conductor 20 and an electrostatic capacitance $C_b$ between the third conductor 50 and the second conductor 30 and can be represented as shown in the expression (3) by using the thickness $h_a$ and the thickness $h_b$.

$$C_T = C_a + C_b = \varepsilon_r \varepsilon_0 S \left( \frac{1}{h_a} + \frac{1}{h_b} \right) \quad (3)$$

In the expression (3), $\varepsilon_0$ represents a dielectric constant of vacuum ($8.855 \times 10^{-10}$ F/m) and S (cm$^2$) represents areas of surfaces of the third conductor 50 that are opposed to the first conductor 20 and the second conductor 30, respectively. Note that the expression (3) is based on assumption that a relative dielectric constant of the dielectric material layer 40 is uniform and the area of one of the surfaces of the third conductor 50 is equal to the area of the other surface of the third conductor 50.

Moreover, it is assumed that k is a sum of the thickness $h_a$ and the thickness $h_b$ (i.e., $k = h_a + h_b$). When a thickness ratio $h_{an}$ obtained by converting the thickness $h_a$ into a ratio with respect to k (i.e., $h_{an} = h_a/k$) is used, the capacitance $C_T$ can be represented as shown in the expression (4).

$$C_T = \frac{\varepsilon_r \varepsilon_0 S}{k} \frac{1}{h_{an}(1 - h_{an})} \quad (4)$$

By normalizing the capacitance $C_T$ given by the expression (4) to the capacitance $C_T$ (han0.5) occurring when the thickness ratio is $h_{an} = 0.5$, an expression (5) is obtained.

$$\frac{C_T}{C_T(h_{an} = 0.5)} = \frac{1}{4h_{an}(1 - h_{an})} \quad (5)$$

As shown in the expression (3), the capacitance $C_T$ is inversely proportional to the thickness $h_a$ and $h_b$ of the dielectric layer. The smaller the thickness, the larger the capacitance $C_T$. The expression (3) also shows that contribution of the thickness $h_b$ of the thinner dielectric layer to the capacitance $C_T$ is larger than the thickness $h_a$ of the thicker dielectric layer. It will be particularly preferable that the thickness $h_b$ of the thinner dielectric layer be between 1.0 and 2.0 times, both inclusive, the thickness $h_c$ of the conductor embedded in the dielectric layer. In this range of the thickness $h_b$, current density concentration at the edge of the conductor due to skin effect is effectively mitigated by allowing concentration to occur also at the upper and lower corners. Thereby, conduction loss is reduced. The thickness $h_c$ may be 10-30 μm and, typically, 25 μm. The thickness $h_b$ may be 20-60 μm and, typically, 40 μm.

Figure 2:
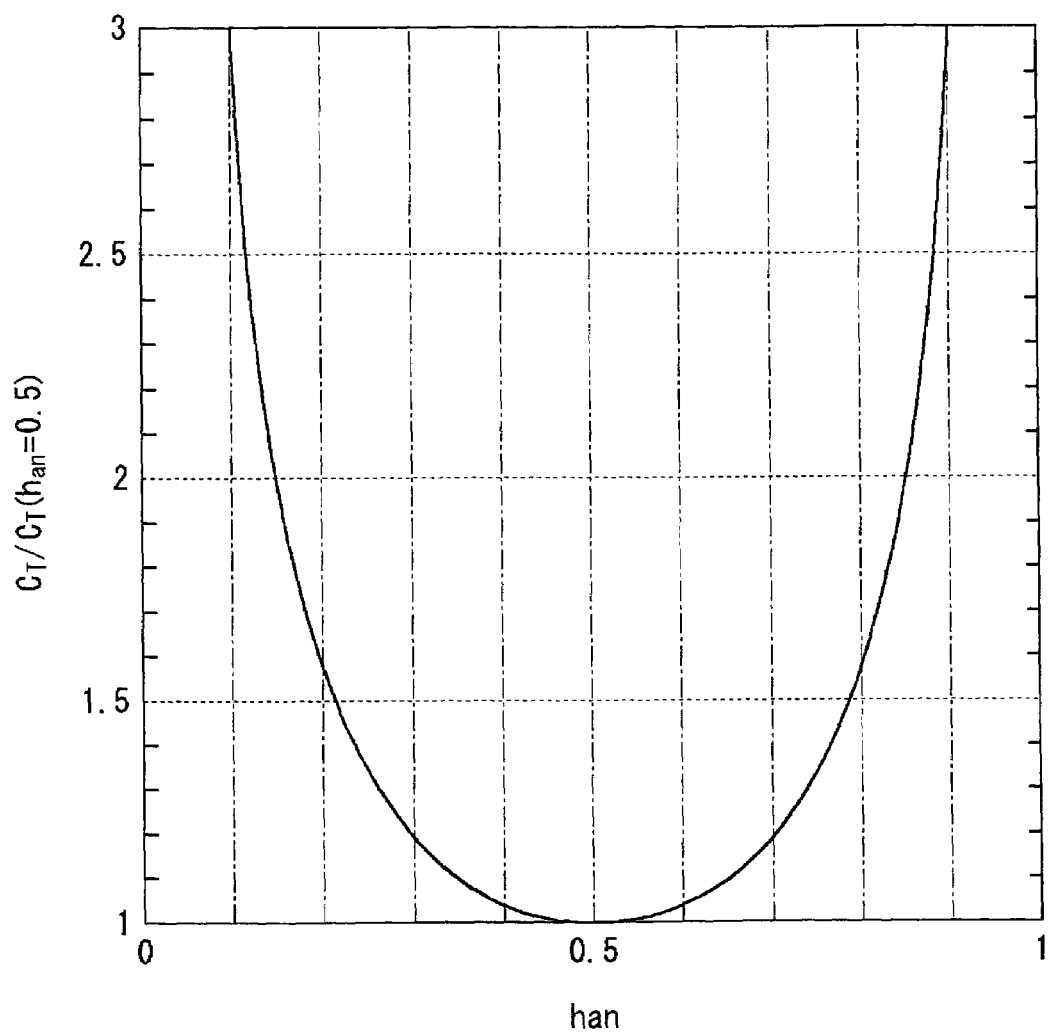
FIG. 2 is a graph showing the relationship between a thickness ratio $h_{an}$ and an electrostatic capacitance $C_T$ with respect to a ground.

FIG. 2 is a graph showing the relationship between the thickness ratio $h_{an}$ and the capacitance $C_T$, the capacitance $C_T(h_{an}=0.5)$ occurring when the thickness ratio $h_{an}$ calculated in accordance with the expression (5) is 0.5 being used as a reference. From FIG. 2, the capacitance $C_T$ becomes minimum when the thickness ratio $h_{an}$ is 0.5, and increases as the thickness ratio $h_{an}$ decreases or increases from 0.5. The increase in the capacitance $C_T$ is pronounced in a range where the thickness ratio $h_{an}$ is 0.2 or less and a range where the thickness ratio $h_{an}$ is 0.8 or more. The wiring board 10 exemplified in FIG. 1 corresponds to a case where the thickness ratio $h_{an}$ is larger than 0.5.

From FIG. 2, it is found that the capacitance $C_T$ is larger in the case where the thickness ratio $h_{an}$ is different from a thickness ratio $h_{bn}$ (where $h_{bn}=h_b/k=1-h_{bn}$) than in the case where the thickness ratio $h_{an}$ is 0.5 as in the conventional wiring board. It will also be understood that characteristic impedance $Z_0$ represented by the expression (1) can be reduced in a triplate line obtained by grounding the first conductor 20 and the second conductor 30.

As described above, the capacitance $C_T$ is increased by shifting the third conductor 50 from a center between the first conductor 20 and the second conductor 30 in the wiring board 10 of this embodiment. Thus, even if the width of the third conductor 50 is made narrower than in a conventional wiring board, a capacitive element with large capacitance is obtained. In a triplate line obtained by grounding the first conductor 20 and the second conductor 30, the characteristic impedance $Z_0$ can be kept the same as that in the case where the line is not made narrower, even if the width of the third conductor 50 is made narrower than in a conventional wiring board.

Next, an effect obtained by setting the angles θ1 and θ2 to obtuse angles as in the wiring board 10 of the first embodiment will be described.

In the case where the thickness $h_b$ is smaller than the thickness $h_a$ as in the wiring board 10 of the first embodiment, a distribution of an electromagnetic field concentrates on a surface of the third conductor 50 on a side closer to the second conductor 30. Thus, the skin effect is pronounced at an edge of third conductor 50, as described above. As a result, the electromagnetic field distribution concentrates on both ends of the third conductor 50 on the side closer to the second conductor 30.

However, the angles θ1 and θ2 of the respective ends of the third conductor 50 on the side closer to the second conductor 30 are set to obtuse angle in the wiring board 10 of the first embodiment. Therefore, concentration of the electromagnetic field distribution hardly occurs and a conductor loss is reduced.

(Method for Forming a Wiring Board)

A method for forming the wiring board 10 shown in FIG. 1 will be described below.

Figure 3A:
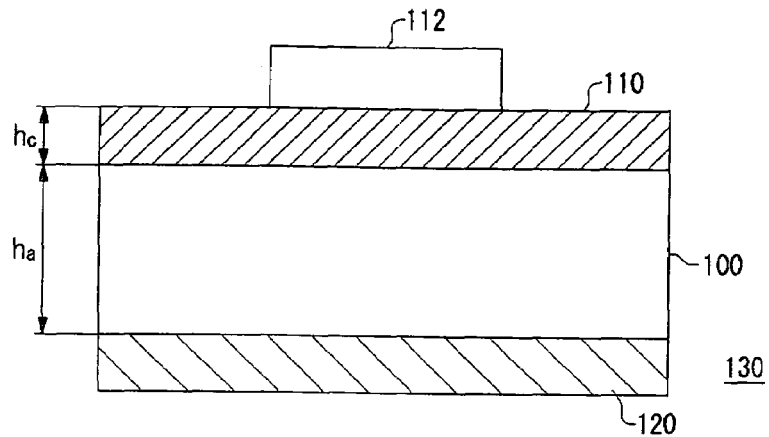
FIGS. 3A to 3C are cross-sectional views showing a method for forming the wiring board of the embodiment of the present invention.

First, a double-layered substrate 130 is prepared, as shown in FIG. 3A. In the double-layered substrate 130, copper foil 110 for forming a third conductor is bonded to one surface of a substrate 100 that has a thickness $h_a$ and is formed from an insulating material such as epoxy resin, and copper foil 120 for the first conductor is bonded to another surface of the substrate 100. The thickness of the copper foil 110 for forming the third conductor is set to $h_c$. Then, a resist 112 for forming the third conductor is applied onto the copper foil 110 for forming the third conductor. Note that the substrate 100 in FIG. 3A is upside down with respect to the wiring board 10 shown in FIG. 1.

Figure 3B:
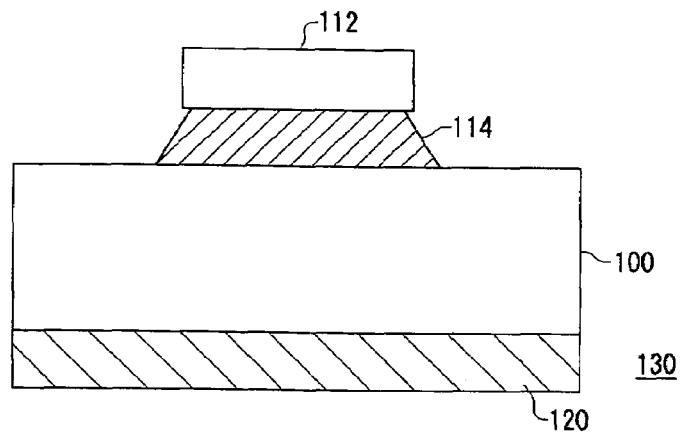

Then, isotropic etching is performed by wet etching using the resist 112 as a mask, as shown in FIG. 3B. The resist 112 can be patterned into a desired shape by lithography. Then, the copper foil 110 is etched by a solution containing ferric chloride as a main ingredient. Thus, a cross section of the copper foil 110 is shaped in a trapezoidal shape to form a third conductor 114 having a trapezoidal cross-sectional shape. In etching, an action of making a trapezoid more acute occurs by spraying an etchant with pressure.

Figure 3C:
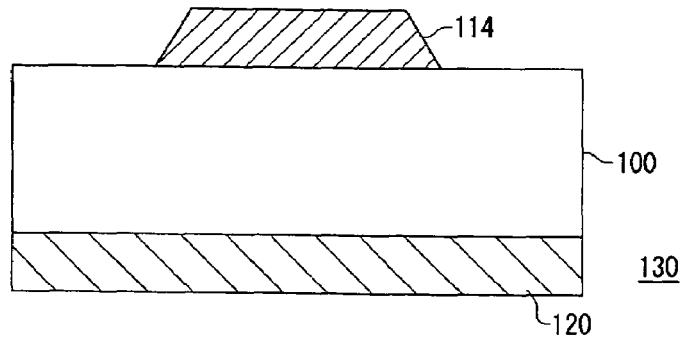

The resist is then removed to expose an upper part of the third conductor 114, as shown in FIG. 3C.

Figure 4A:
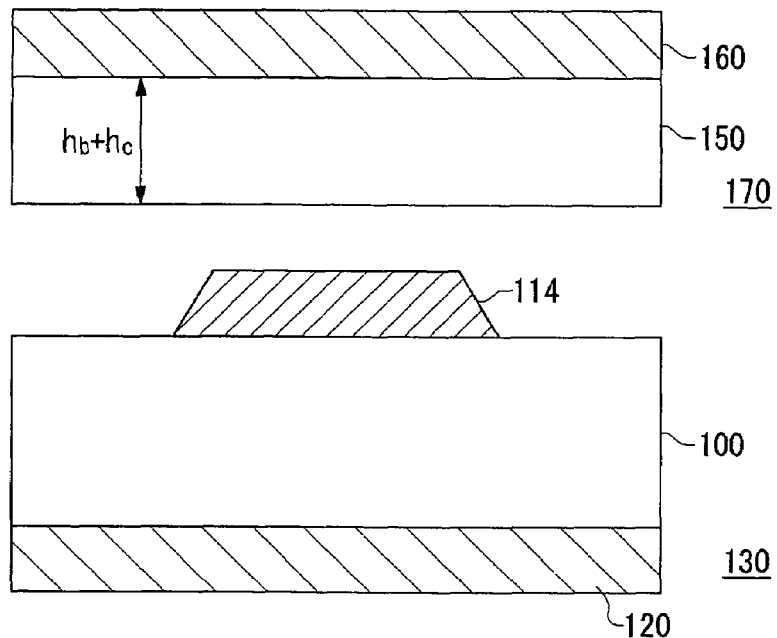
FIGS. 4A and 4B are cross-sectional views showing the method for forming the wiring board of the embodiment of the present invention.

On the other hand, a single-layered substrate 170 is prepared, as shown in FIG. 4A. In the single-layered substrate 170, copper foil 160 for the second conductor is bonded to one surface of a substrate 150 that has a thickness $h_b+h_c$ and is formed from an insulating material such as epoxy resin.

Figure 4B:
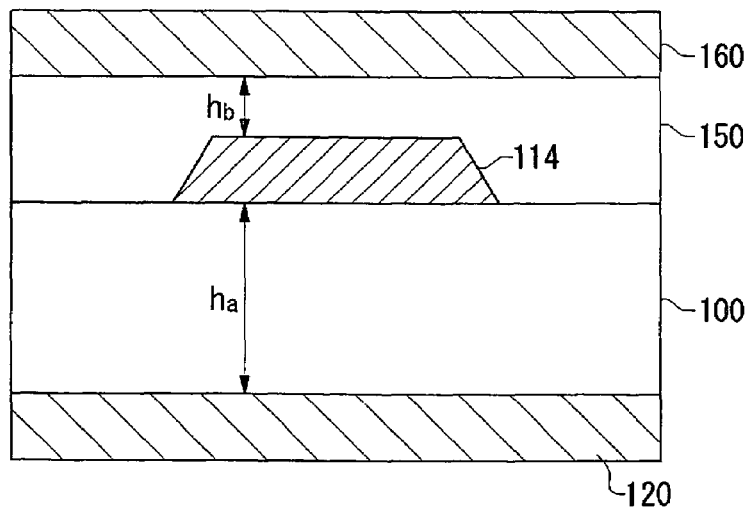

Then, the double-layered substrate 130 and the single-layered substrate 170 are bonded to each other with the third conductor 114 sandwiched therebetween by thermocompression bonding, as shown in FIG. 4B. Thereby, the wiring substrate 10 as shown in FIG. 1 can be obtained by turning the double-layered substrate 130 and the single-layered substrate 170 thus bonded upside down. Wiring patterns are formed on the copper foil 120 and the copper foil 160 by lithography or etching. By forming a via hole connecting the copper foil 120 and the copper foil 160 by via drilling or laser drilling, and by embedding a conductor such as copper in the via hole, the copper foil 120 and the copper foil 160 are electrically connected. This ensures that the copper foil 120 (the first conductor 20 of FIG. 1) and the copper foil 160 (the second conductor 30 of FIG. 19 are maintained at the same potential. By grounding one of the copper foil 120 and the copper 160, the copper foil 120 and the copper foil 160 are grounded.

Second Embodiment

Figure 5:
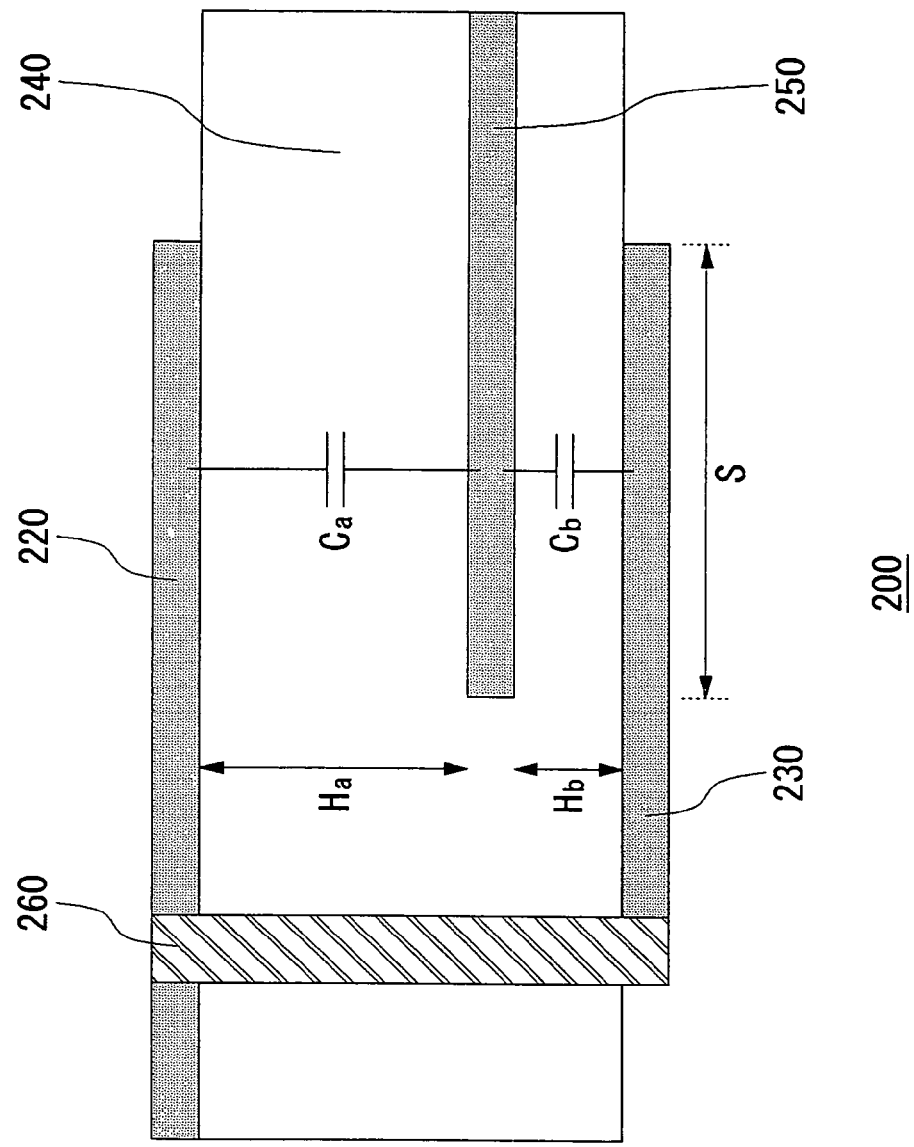
FIG. 5 is a cross-section view showing a wiring board of a second embodiment.

FIG. 5 is a cross-sectional view of the structure of a wiring board 200 according to a second embodiment of the present invention. The wiring board 200 according to the second embodiment is a capacitive element. The wiring board 200 comprises a first conductor 220, a second conductor 230, a dielectric material layer 240 provided between the first conductor 220 and the second conductor 230, a third conductor 250 embedded in the dielectric material layer 240, a via 260 electrically connecting the first conductor 220 and the second conductor 230, and a via 270 electrically connecting the first conductor 220 and the third conductor 250.

A comb capacitor is created in an area of the wiring board 200 where the first conductor 220, the second conductor 230 and the third conductor 250 are superimposed on one another (area S indicated in FIG. 5). Given that the electrostatic capacitance between the first conductor 220 and the third conductor 250 is denoted by $C_a$ and the electrostatic capacitance between the second conductor 230 and the third conductor 250 by $C_b$, the total electrostatic capacitance of the wiring board 200 is given by $C_T=C_a+C_b$.

In the wiring board 200 according to the second embodiment, the interval $H_b$ between the second conductor 230 and the third conductor 250 is shorter than the interval $H_a$ between the first conductor 220 and the second conductor 230. This results in relatively large total electrostatic capacitance $C_T$ of the wiring board 200, as explained with reference to the expressions (4) and (5). As a result, a capacitive element with relatively large capacitance is obtained even if the width of the third conductor 250 is made narrower than in the related art.

Third Embodiment

Figure 6:
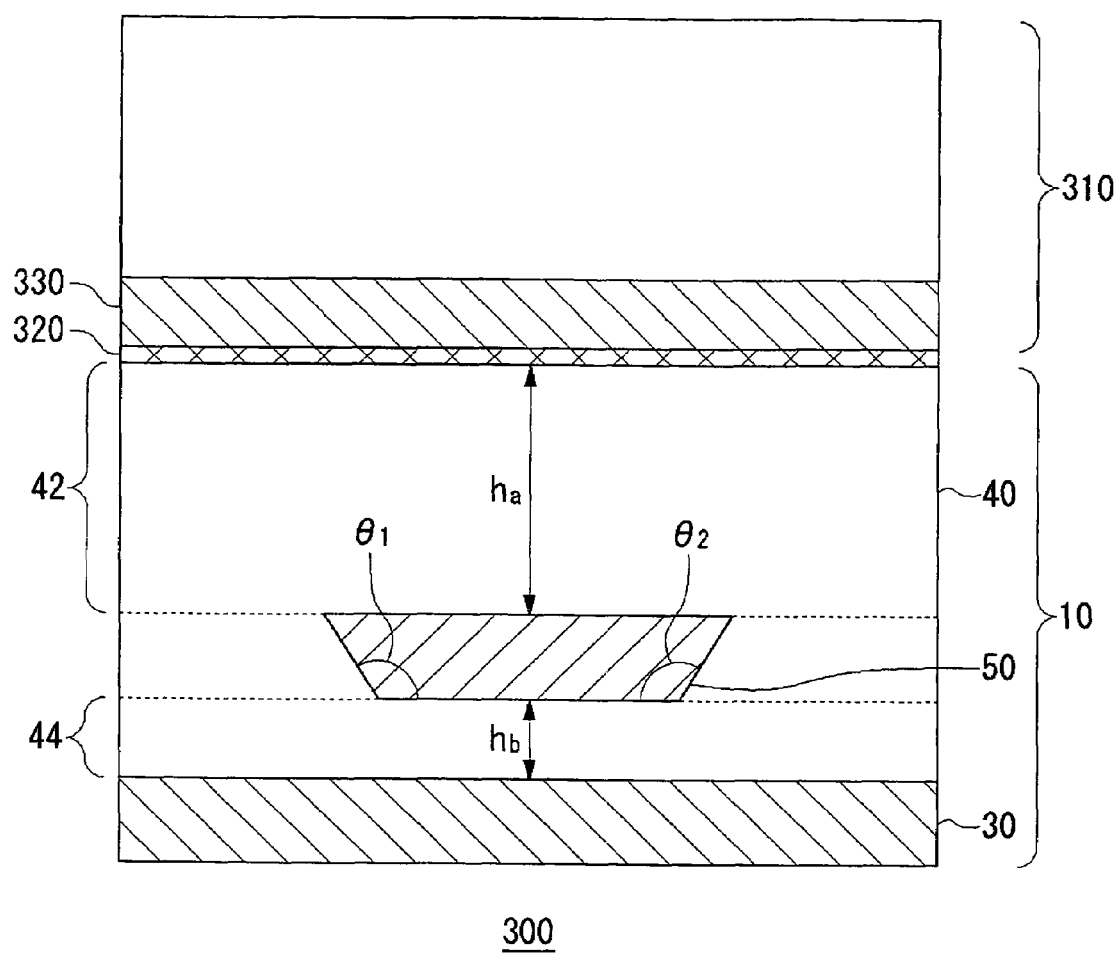
FIG. 6 is a cross-sectional view showing the structure of a circuit apparatus of a third embodiment.

FIG. 6 is a cross-sectional view showing the structure of a circuit apparatus 300 according to a third embodiment of the present invention. The circuit apparatus 300 comprises a wiring board 10 and a circuit component 310. The structure of the wiring board 10 according to the third embodiment is similar to that of the wiring board 10 according to the first embodiment except that an adhesive layer 320 is provided between a grounded wiring 330 and the dielectric material layer 40.

The circuit component 310 is a semiconductor chip such as an integrated circuit (IC) and a large scale integrated circuit (LSI). Alternatively, the circuit component 310 may be a surface-mounted passive component or an electronic component formed by integrating such components. The grounded wiring 330 is formed on the mounting surface of the circuit component 310.

The wiring board 10 and the circuit component 310 are adhesively attached to each other by the adhesive layer 320. The adhesive layer 320 may be formed of conductive silver paste or the like.

The above-described structure allows the grounded wiring 330 of the circuit component 310 and the conductive adhesive layer 320 integrated therewith after mounting to function as the first conductor 20 in the first embodiment. It is therefore possible to form the circuit apparatus 300 such that a two-layer structure of the wiring layers of the wiring board 10 is maintained. As a result, the circuit apparatus not only includes wiring layers of the first embodiment that provide the aforementioned benefits but also is formed as a simplified and small-sized structure.

The present invention is not limited to the aforementioned embodiment. Various modifications can be made based on the knowledge of those skilled in the art. Embodiments with such a modification may fall within the scope of the present invention.

Figure 7:
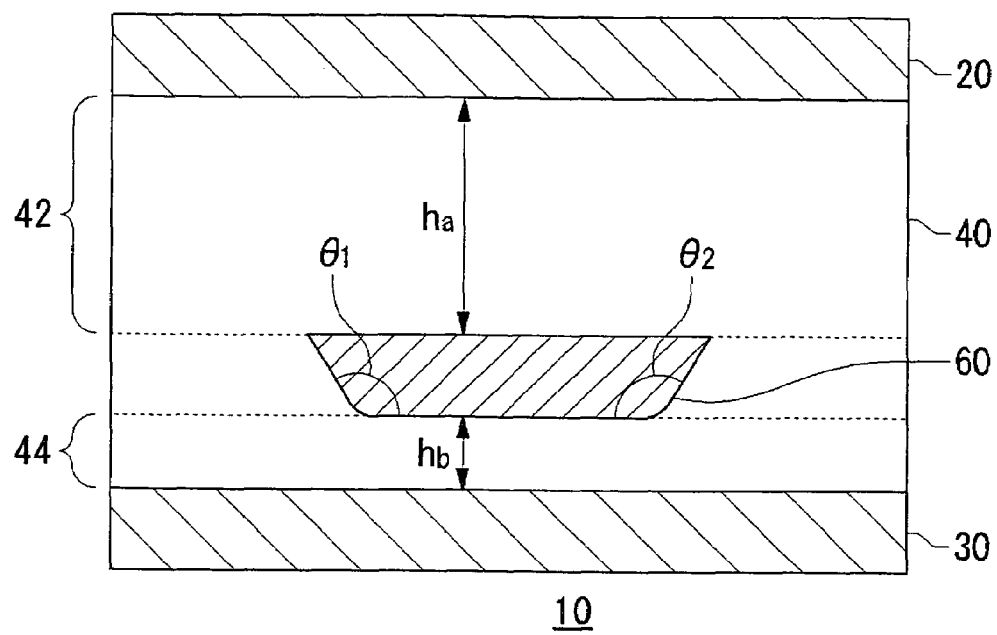
FIG. 7 is a cross-sectional view showing a wiring board of a modified example.
Figure 8:
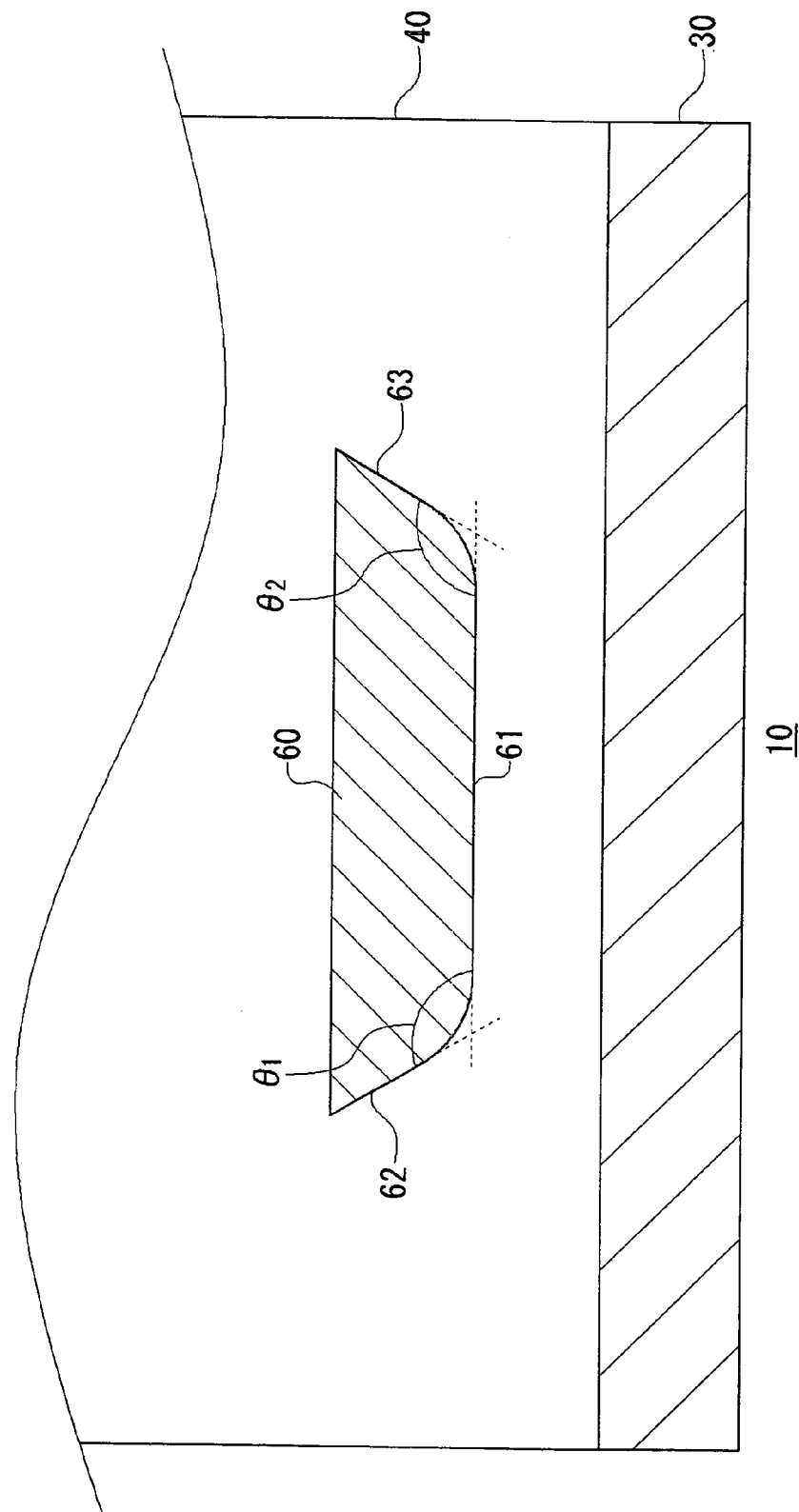
FIG. 8 is an enlarged view of a third conductor in the wiring board of the modified example.

For example, in the aforementioned embodiment, the cross-sectional shape of the third conductor 50 is trapezoidal and a straight shorter side and straight hypotenuses of the trapezoid form angles θ1 and θ2 at respective ends of the third conductor 50 on the side closer to the second conductor 30. However, both ends of a third conductor 60 on a side closer to the second conductor 30 may be rounded, as shown in FIG. 7. In this case, as shown in FIG. 8, it is sufficient that angles θ1 and θ2 formed by a line obtained by extrapolating a shorter side 61 of the third conductor 60 and lines obtained by extrapolating hypotenuses 62 and 63, respectively, are obtuse.

Due to this, concentration of the electromagnetic field distribution at both ends of the third conductor 60 on the side closer to the second conductor 30 can be made less dense, thereby further reducing the conductor loss.

In the aforementioned formation process of the wiring board 10, a certain level of curvature must be generated at both ends of the third conductor 50 on the side closer to the second conductor 30, when the both ends are seen microscopically. Therefore, in the case where "angles of respective ends of the third conductor that face thinner one of the first and second regions of the dielectric material layer are obtuse", as recited in claim 3 or 4, it is apparent that the scope of the claim encompass the case where those ends are rounded when seen with a scanning electron microscope, for example.

Figure 9:
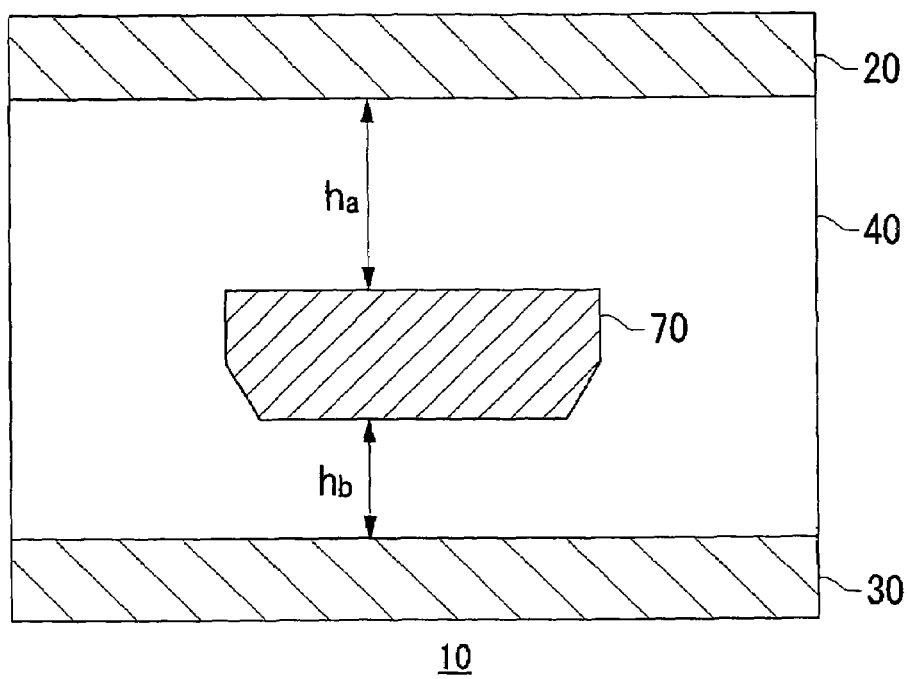
FIG. 9 is a cross-sectional view showing a wiring board of another modified example.
Figure 10:
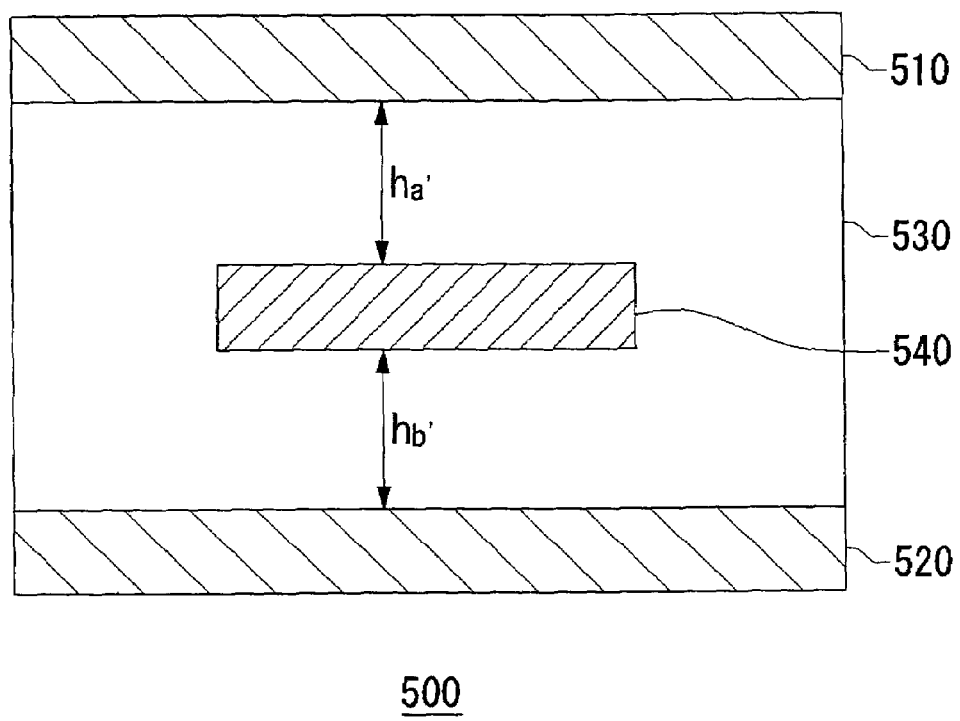
FIG. 10 shows a cross-sectional shape of a conventional wiring board.

Moreover, the cross-sectional shape of the third conductor in which the angles θ1 and θ2 of respective ends of the third conductor 50 on the side closer to the second conductor 30 are obtuse is not limited to a trapezoidal shape shown in FIG. 1. Alternatively, it may be a polygonal shape based on a rectangular shape, in which both ends of a third conductor 70 on the side closer to the second conductor 30 are cut, as shown in FIG. 9. The third conductor having the polygonal cross-sectional shape described above can also make the line narrower in the wiring board easily and can reduce the transmission loss in the wiring board.

The embodiments described above are based on assumption that the dielectric material layer is formed from a material having a uniform relative dielectric constant. However, the present invention is not limited to the case where the relative dielectric constant of the dielectric material layer is uniform. A relative dielectric constant of the dielectric material layer in the first region 42 and that in the second region 44 may be different from each other.

When a dielectric material having a higher relative dielectric constant is used for the dielectric material layer in thinner one of the first and second regions 42 and 44, the electrostatic capacitance of the wiring board 10 can be increased. Therefore, it is possible to make the line further narrower in the wiring board 10.

Making the relative dielectric constant of the dielectric material layer in the first region 42 and that in the second region 44 different from each other can be easily achieved by the method which bonds the substrate 100 and the substrate 150 both formed from an insulating material to each other so as to form the dielectric material layer, as shown in FIG. 4A. In FIG. 4A, epoxy resin with alumina filler having a relative dielectric constant of 7.0 can be used for the thinner substrate 100 and epoxy resin (FR4) having a relative dielectric constant of approximately 4.4 can be used for the thicker substrate 150, for example.

What is claimed is:

1. A wiring board comprising:
   a first conductor;
   a second conductor provided in a wiring layer different from that of the first conductor maintained at the same potential as the first conductor;
   a dielectric material layer provided between the first and second conductors; and
   a third conductor embedded in the dielectric material layer, wherein
   a thickness of a first region of the dielectric material layer located between the third conductor and the first conductor is different from a thickness of a second region of the dielectric material layer located between the third conductor and the second conductor, and obtuse angles are formed at the ends of the third conductor facing the thinner of the first region and the second region of the dielectric material layer, in a cross section of the third conductor perpendicular to the direction of signal transmission.

2. The wiring board according to claim 1, wherein
   a relative dielectric constant of thinner one of the first and second regions is higher than that of the other region.

3. The wiring board according to claim 1, wherein:
   the thickness of the thicker of the first region and the second region of the dielectric layer is four times or greater than thickness of the thinner region.

4. The wiring board according to claim 1, wherein the thickness of the thinner of the first region and the second region of the dielectric layer is between 1.0 and 2.0 times the thickness of the third conductor.

5. The wiring board according to claim 1, wherein:
   a shape of the third conductor in the cross section perpendicular to the transmission direction of the third conductor is trapezoidal; and
   a shorter side of the trapezoidal third conductor faces thinner one of the first and second regions of the dielectric material layer.

6. The wiring board according to claim 2, wherein:
   a shape of the third conductor in the cross section perpendicular to the transmission direction of the third conductor is trapezoidal; and
   a shorter side of the trapezoidal third conductor faces thinner one of the first and second regions of the dielectric material layer.

7. The wiring board according to claim 1, wherein the first conductor and the second conductor are grounded.

8. The wiring board according to claim 2, wherein the first conductor and the second conductor are grounded.

9. A circuit apparatus which includes the wiring board according to claim 7 and a circuit component with grounded wiring, wherein one of the first and second conductors is formed by the grounded wiring.

10. The circuit apparatus according to claim 9, wherein one of the first and second conductors further comprises a conductive adhesive layer adhesively attaching the grounded wiring to the dielectric layer.

* * * * *